Nov. 18, 1969 C. P. SANDBANK ET AL 3,479,611

SERIES OPERATED BURN EFFECT DEVICES

Filed Jan. 18, 1967

Inventors
CARL P. SANDBANK
GEORGE KING
STANLEY B. MARSH
By A. L. Lessler
Attorney United States Patent Office 3,479,611

Patented Nov. 18, 1969

3,479,611

SERIES OPERATED GUNN EFFECT DEVICES

Carl Peter Sandbank, Bishop's Stortford, and George King and Stanley Bruce Marsh, Harlow, England, assignors to International Standard Electric Corporation, New York, N.Y., a corporation of Delaware Filed Jan. 18, 1967, Ser. No. 610,115
Claims priority, application Great Britain, Jan. 21, 1966, 2,892/66
Int. Cl. H03b *5/14, 7/14, 11/10*
U.S. Cl. 331—52 5 Claims

ABSTRACT OF THE DISCLOSURE

A high voltage, high power Gunn effect device in which two two-terminal Gunn effect structures are connected in series and a voltage is applied across the series combination sufficient to cause Gunn oscillations in both devices. Means are provided for synchronizing the Gunn oscillations produced by the two devices.

Related applications

The subject matter of this invention is generally related to that disclosed in U.S. patent application Ser. Nos. 583,003 (filed Sept. 29, 1966); 583,036 (filed Sept. 29, 1966); 585,900 (filed Oct. 11, 1966); and 597,975 (filed Nov. 30, 1966).

Background of the invention

The invention relates to semiconductor devices for high power operation including semiconductive material exhibiting moving high field instability effects, and to apparatus embodying such devices.

If a crystal of one of certain semiconductive materials is subjected to a steady electric field exceeding a critical value the resultant current flowing through the crystal contains an oscillatory component of frequency determined by the transit of a space charge distribution between the crystal contact areas. The phenomenon occurs at ordinary temperatures, does not require an applied magnetic field and does not appear to involve a special specimen doping or geometry; it was first reported by J. B. Gunn (Solid State Communications, volume 1, p. 88, 1963) and is therefore known as the Gunn effect. The Gunn effect arises from the heating of electrons, normally in a low effective mass high mobility sub-band ($K=0$), by the electric field and consequent transfers into a higher effective mass lower mobility sub-band ($K=100$). This process gives rise to an electron drift velocity (or current) versus applied field characteristics with a region of negative differential conductivity. For an applied bias within the negative conductance region a high field region, termed a domain, moves from cathode to anode during one cycle of current oscillation. The frequency of oscillation is determined primarily by the length of the current path through the crystal. The phenomenon has been detected in III–V semiconductors such as gallium arsenide, indium phosphide and cadmium telluride having n-type conductivity.

The term "semiconductive material exhibiting high field instability effects" is used herein to include at least any material exhibiting the Gunn effect as defined in the preceding paragraph, or exhibiting similar functional phenomena which may be based on somewhat different internal mechanisms.

The value of the applied field below which spontaneous self-oscillation does not occur can be termed the Gunn threshold value.

The production of high peak-power from Gunn effect oscillators is dependent on the development of circuit-device combinations which present an adequate high impedance to both the R.F. and the drive circuits.

Summary

According to a feature of the invention a semiconductive circuit arrangement includes at least two bodies of semiconductive material exhibiting high field instability effects connected in series with each other and a source of potential difference such that high field domains are formed within and caused to propagate along each of said bodies.

In the drawing

Detailed description

When a semiconductor device which exhibits the Gunn effect is over-driven, for example, to a value of three or four times the threshold value the high field domain (established within the semiconductor device when the electrical field within the device which is produced by an external source of potential difference, exceeds the threshold value for the semiconductive material) takes up some of the extra voltage until a point is reached where impact ionization occurs. Impact ionization limits the spread of the high field region, thus the additional bias or external source of potential difference is taken up by the bulk of semiconductive material outside the high field domain and would lead to the formation of further domains.

Figure 1:
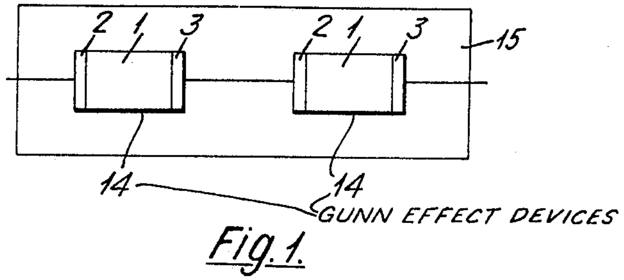
FIGURE 1 shows diagrammatically two semiconductor devices connected in series according to the invention.

If two semiconductor devices were connected in series with each other as shown in the drawing according to FIGURE 1 and a source of potential difference (not shown in the drawing) such that a high field domain exists within one of the semiconductor devices, then under these conditions it is thought that the additional external source of potential difference which results when overdriving the series combination will form a high field domain in the other of the semiconductor devices when the impact ionization limit is reached in said one of the semiconductor devices providing the field in the ohmic part of the circuit is high enough for the electron transfer and consequent high field domain formation to occur i.e. the ionizing mechanism allows the current to rise without a corresponding increase in the voltage across the high field domain formed within said one of the semiconductor devices until the threshold value is reached in the other of the semicoinductor devices when a high field domain will be formed therein. The time taken for the formation of the second high field domain is finite, but could in practice be a very small part of the cycle time, i.e. one high field domain transit, therefore the high field domains formed within the semiconductor devices are effectively in phase. The first formed high field instability domain will be formed within the semiconductor device having the highest impedance.

It is possible, therefore, to connect a plurality of semiconductor devices which exhibit the Gunn effect in series with each other and the devices will be operated in turn as outlined in the previous paragraph. Operating the semiconductor device in series eases the external power supply problem by presenting the external power supply source with a higher impedance, for a given power output and efficiency level.

The output from the system may be taken independently from each unit or the combined output may be used depending in the power and other requirements of the acceptance circuit.

The electrical field established within the device which causes the circuit to be overdriven or causes high field domains to be established within the semiconductor devices may be continuously applied or pulsed to reduce the total power dissipation in the semiconductor devices.

It is possible to obtain power outputs from these devices of the order of 200 watts at a frequency of 1.5 gc./s. under pulsed conditions.

Increased efficiency of the system will result if the semiconductive devices are operated in a resonant circuit. The resonant circuit phase locks the output and prevents frequency drift due to temperature changes. Efficiencies of up to 10% are possible and to obtain this high efficiency in resonance circuits it is necessary to apply a large overdriving potential to the devices.

Figure 3:
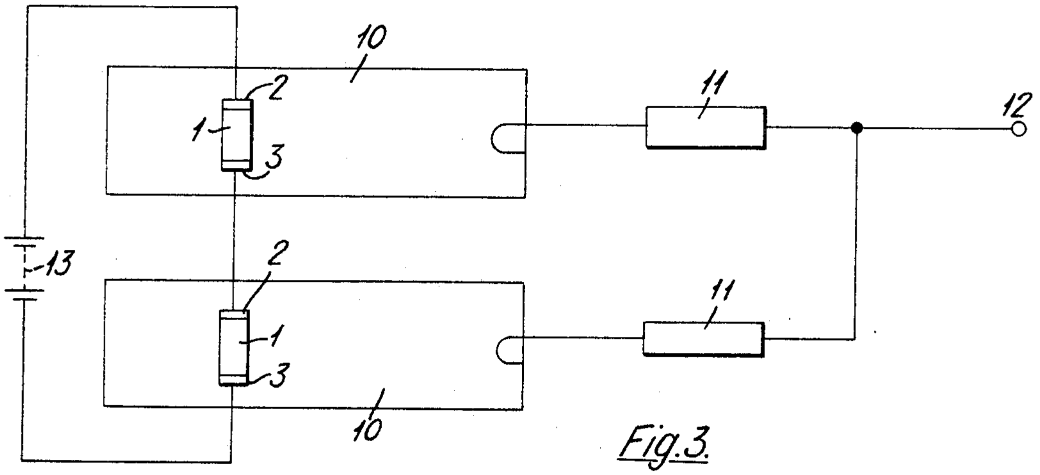
FIGURE 3 shows diagrammatically the two series connected semiconductor devices shown in the drawing according to FIGURE 1 each associated with a single resonant cavity and coupled to give a paralleled R.F. output.

Alternatively, instead of having a plurality of devices connected in series in a single resonance circuit or cavity 15, as indicated in FIG. 1, it is possible to use a number of cavities each having a single semiconductor device associated therewith and coupled to give a paralleled R.F. output from the semiconductor devices as is shown diagrammatically in the drawing according to FIGURE 3.

Referring to FIGURE 3 the two series connected semiconductor devices shown in the drawing according to FIGURE 1 are each shown diagrammatically associated with a single resonant cavity 10 and connected to an electrical bias supply 13. The outputs of the resonant cavities 10 are each connected to an output terminal 12 via a controllable amount of isolation 11 to give a paralleled R.F. output from the two semiconductor devices. In this arrangement better control over the applied voltage affecting the individual semiconductor devices is achieved while retaining the series combination from the point of view of the drive circuit.

Referring to FIGURE 1, thet individual semiconductor devices 14 consist of a crystal 1 of semiconductive material with the necessary electrical properties, for example, n-type gallium arsenide having ohmic contact areas 2 and 3 secured to its plane end faces.

In practice, the crystal 1 may be formed on a semi-insulating substrate, for example, gallium arsenide by epitaxial growth or alternatively a solid piece of semiconductive material may be used. The contact areas 2 and 3, for example, tin, are formed on the end faces of the crystal 1, for example, by vacuum evaporation. The device is then heat treated in a reducing atmosphere containing a fluxing agent to alloy the metal semiconductor joint to form an ohmic junction.

Figure 2:
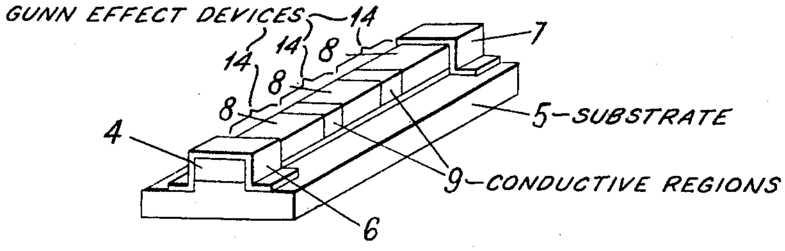
FIGURE 2 shows three semiconductor devices connected in series in the form of a solid state circuit.

The series connected devices may be individually manufactured and connected as shown in the drawing according to FIGURE 1 or they may be made, for example by epitaxially growing a layer of semiconductive material 4 on the surface of a substrate 5 as shown in the drawing according to FIGURE 2 and as detailed in the preceding paragraph. The epitaxial grown layer 4 is then divided into a series of discrete areas 8 of the epitaxially grown semi-conductive material, each one being connected in series in ohmic contact with the others by means of the conductive sections 9. The interconnecting sections 9 situated between adjacent areas 8 are arranged not to support or allow propagation of the high field domain therein. The external circuit is connected to the device by means of the ohmic contact areas 6 and 7, for example of tin. The contact areas 6 and 7 are formed at each end of the series connected epitaxially deposited areas 8, for example, by vacuum evaporation. The device is then heat treated in a reducing atmosphere containing a fluxing agent to alloy the metal semiconductor joint to form an ohmic junction.

While the principles of the invention have been described above in connection with specific embodiments, and particular modifications thereof, it is to be clearly understood that this description is made only by way of example and not as a limitation on the scope of the invention.

What we claim is:

1. A semiconductor circuit arrangement, comprising:

a first body of semiconductive material exhibiting high field instability effects in portions of said body subjected to an electric field in excess of a first threshold value;

means for applying a potential difference between first and second spaced contact areas on said body;

a second body of semiconductive material exhibiting high field instability effects in portions of said second body subjected to an electric field in excess of a second threshold value;

means for applying a potential difference between third and fourth spaced contact areas of said second body;

conductive means for providing an ohmic connection between said second and third contact areas;

an input circuit for applying between said first and fourth contact areas a given potential difference at least three times the value of said first threshold value causing the generation of a first moving high field domain and impact ionization to occur in said first body whereby a second moving high field domain is generated in said second body and is locked in phase with said first domain;

an output circuit; and means for coupling energy associated with at least one of said moving high field domains to said output circuit.

2. A circuit arrangement according to claim 1 wherein said coupling means includes a resonant cavity, both said bodies being disposed in said cavity such that the energy coupled from the moving high field domain associated with said first body is locked in fixed phase relationship with the energy coupled from the moving high field domain associated with said second body.

3. A circuit arrangement according to claim 1 wherein each of said bodies is associated with a corresponding resonant cavity, said resonant cavities being electrically interconnected.

4. A circuit arrangement according to claim 1, wherein said first and second bodies comprise spaced epitaxially deposited regions on the surface of a substrate, said regions being connected in series by a conductive member contacting said second and third spaced contact areas.

5. A circuit arrangement according to claim 1, wherein said semiconductor material comprises gallium arsenide.

References Cited

UNITED STATES PATENTS

| | | | |
|---|---|---|---|
| 2,605,383 | 7/1952 | Spencer | 331—56 X |
| 3,246,256 | 4/1966 | Sommers | 331—107 |

OTHER REFERENCES

Brady et al.: "Recent Results With Epitaxial GaAs Gunn Effect Oscillators," Proceedings of the IEEE, October 1966, pp. 1497, 1498.

"Phase-Locking on Pulsed Gunn Oscillators," Proceedings of the IEEE, November 1966, p. 1591.

Electronic Engineering, September 1965, p. 597, "A Gunn Effect Epitaxial Device for Microwave Application."

Robson et al.: "Some Aspects of Gunn Effect Oscillations," Radio and Electronic Engineer, December 1965, pp. 348–352.

ROY LAKE, Primary Examiner

SIEGFRIED H. GRIMM, Assistant Examiner

U.S. Cl. X.R.

317—234; 331—107